(12) United States Patent
Forbes et al.

(10) Patent No.: US 6,683,337 B2
(45) Date of Patent: Jan. 27, 2004

(54) DYNAMIC MEMORY BASED ON SINGLE ELECTRON STORAGE

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 09/779,547

(22) Filed: Feb. 9, 2001

(65) Prior Publication Data

US 2002/0109158 A1 Aug. 15, 2002

(51) Int. Cl.$^7$ ................................................ H01L 29/76
(52) U.S. Cl. ....................... 257/215; 257/236
(58) Field of Search ................. 257/215, 235, 257/236

(56) References Cited

U.S. PATENT DOCUMENTS

| | | | |
|---|---|---|---|
| 4,419,809 A | | 12/1983 | Riseman et al. |
| 5,132,656 A | * | 7/1992 | Munroe |
| 5,599,738 A | | 2/1997 | Hashemi et al. |
| 5,828,090 A | * | 10/1998 | Ugajin |
| 5,989,947 A | | 11/1999 | Dilger et al. |
| 6,069,380 A | | 5/2000 | Chou et al. |
| 6,159,620 A | | 12/2000 | Heath et al. |

FOREIGN PATENT DOCUMENTS

| | | |
|---|---|---|
| EP | 0 463 817 A2 | 1/1992 |
| EP | 0 463 817 A3 | 1/1992 |
| JP | 58003270 | 10/1983 |
| WO | WO 99/66561 | 12/1999 |

OTHER PUBLICATIONS

Horioka, K. et al, "Highly selective and directional etchings of phosphorous doped polycrystalline silicon with tri–level resist mask employing magnetron plasma", 1998 symposium on VLSI Technology, Digest of Technical Papers, p. 81–2, 1998.

Matsuura et al, "Directional etchings of Si with perfect selectivity to $SiO_2$ using an ultraclean electron cyclotron resonance plasma", Applied Physics Letters, vol. 56, No. 14, pp. 1339–1341, 1990.

Esashi, M. et al, "High–rate directional deep dry etching for bulk silicon micromachinings", Journal of Micromechanics and Microengineering, vol. 5, No. 1, pp. 5–10, 1995.

Boswell, E.C. et al, "Polysilicon field emitters", J. of Vac. Sci. and Technol. B., vol. 14, No. 3, pp. 1910–1913, 1996.

Mescher, M.J. et al, "A dry etch fabrication process for microelectromechanical devices using silicon nitride sacrificial layers", Proc. Of InterPACK '97, vol. 1, p. 4358, 1997.

(List continued on next page.)

*Primary Examiner*—Stephen D. Meier
(74) *Attorney, Agent, or Firm*—Dickstein Shapiro Morin & Oshinsky LLP

(57) ABSTRACT

A method for forming edge-defined structures with sub-lithographic dimensions which are used to further form conduction channels and/or storage structures in memory cells. Sacrificial silicon nitride islands are deposited at low temperatures and then patterned and etched by high resolution etching techniques. Polysilicon is next deposited over the sacrificial silicon nitride islands and directionally etched to form edge-defined polysilicon dot and strip structures which are about one tenth the minimum feature size. The edge-defined polysilicon strips and dots are formed between the source and drain region of an NMOS device. Subsequent to the removal of the sacrificial silicon nitride islands, the edge-defined polysilicon strips and dots are used to mask a threshold voltage implantation in a conventional CMOS process. A conduction channel and two adjacent potential minimum dots are formed after the removal of the edge-defined polysilicon strips and dots.

29 Claims, 14 Drawing Sheets

OTHER PUBLICATIONS

Regis, J.M. et al, "Reactive ion etch of silicon nitride spacer with high selectivity to oxide", Proceedings of 1997 IEEE/ SEMI Advanced Semiconductor Manufacturing Conference and Workshop, pp. 252–256, 1997.

Ying Wang et al, "High–selectivity silicon nitride etch process", Semiconductor International, vol. 21, No. 8, pp. 235–240, 1998.

Alkaisi, M.M. et al, "Nanolithography using wet etched nitride phase masks", Journal of Vacuum Science and Technology B, vol. 16, No. 6, pp. 3929–3933, 1998.

Panepucci, R.R. et al, "Silicon nitride deposited by electron cyclotron resonance plasma enhanced chemical vapor deposition for micromachining applications", Proc. Of the SPIE, vol. 3512, pp. 146–151, 1998.

Lapeyrade, M. et al, "Silicon nitride films deposited by electron cyclotron resonance plasma–enhanced chemical vapor deposition", Journal of Vacuum Science and Technology A, vol. 17, No. 2, pp. 433–444, 1999.

Ono, Yukinori et al., "Fabrication Method for IC–Oriented Sl Single–Electron Transistors", IEEE Transactions of Electron Devices, vol. 47, No. 1, Jan. 2000.

Takahashi et al., "Fabrication technique for Sl single–electron transistor operating at room temperature", Electronics Letters, IEE Stevenage, GB, vol. 31, No. 2, Jan. 1995.

Park G., et al., "A Nano–Structure Memory with Silicon on Insulator Edge Channel and a Nano Dot", Japanese Journal of Applied Physics, vol. 37, No. 12B, Dec. 1998.

* cited by examiner

DYNAMIC MEMORY BASED ON SINGLE ELECTRON STORAGE

FIELD OF THE INVENTION

The present invention relates to the field of semiconductor devices and, in particular, to charge storage structures of memory devices.

BACKGROUND OF THE INVENTION

A dynamic random access memory (DRAM) cell typically comprises a charge storage capacitor (or cell capacitor) coupled to an access device such as a Metal-Oxide-Semiconductor Field Effect Transistor (MOSFET). The MOSFET applies or removes charge on the capacitor, affecting therefore a logical state defined by the stored charge. The conditions of DRAM operations, such as operating voltage, leakage rate and refresh rate, will generally mandate that a certain minimum charge be stored by the capacitor. In the continuing trend to higher memory capacity, the packing density of storage cells must increase, yet each must maintain required capacitance levels for a respective memory cell area. Accordingly, it is becoming extremely difficult to produce a capacitor with a relatively high storage capacitance on the available memory cell area.

With a view towards further miniaturization of electronic devices, single-electron components have been introduced, in which switching processes are effected with single electrons. This way, techniques for memory systems in silicon technology based on (1) trapping of single electrons on silicon inclusions in the gate oxide of transistors; (2) trapping of electrons at traps or point defects in the gate oxide; (3) trapping of electrons on the grains of polysilicon in thin film transistors; or (4) trapping of single electrons in potential minimum regions in an ultra-thin film of roughened silicon on insulator material have been disclosed. Most of these techniques, however, involve the tunneling of electrons through thin oxides, which in turn requires high electric fields in such oxides. Such high electric fields degrade the oxides and confer only a limited number of memory cycling times, typically in the order of $10^9$ times. Other single-electron techniques involve the trapping of electrons on polysilicon grains formed in thin film devices, but this process is difficult to control since the roughening of the polysilicon to form the grains occurs randomly.

Accordingly, there is a need for an improved method of forming single-electron devices used in IC fabrication. There is also a need for high density single-electron memory devices with conduction channels and storage areas which are easily reproducible and which do not occur in a random manner, as well as a method for fabricating such memory devices.

BRIEF SUMMARY OF THE INVENTION

The present invention provides a method for forming edge-defined structures with sub-lithographic dimensions which are used to further form conduction channels and/or storage structures in single-electron memory devices.

In an exemplary embodiment of the invention, sacrificial silicon nitride islands are deposited at low temperatures and then patterned and etched by high resolution etching techniques. Polysilicon is next deposited over the sacrificial silicon nitride islands and directionally etched to form edge-defined polysilicon dot and strip structures which are about one tenth the minimum feature size.

In an exemplary embodiment of the invention, edge-defined polysilicon strips and dots are formed between the source and drain region of an NMOS device. Subsequent to the removal of the sacrificial silicon nitride islands, the edge-defined polysilicon strips and dots are used to mask a threshold voltage implantation in a conventional CMOS process. This way, a conduction channel and two adjacent potential minimum dots are formed after the removal of the edge-defined polysilicon strips and dots. The presence or absence of electrons in these potential minimum dots will modulate the number of electrons in the conduction channel of, for example, a single-electron DRAM of very high density.

Additional advantages of the present invention will be more apparent from the detailed description and the accompanying drawings, which illustrate exemplary embodiments of the invention.

DETAILED DESCRIPTION OF THE INVENTION

Figure 1:
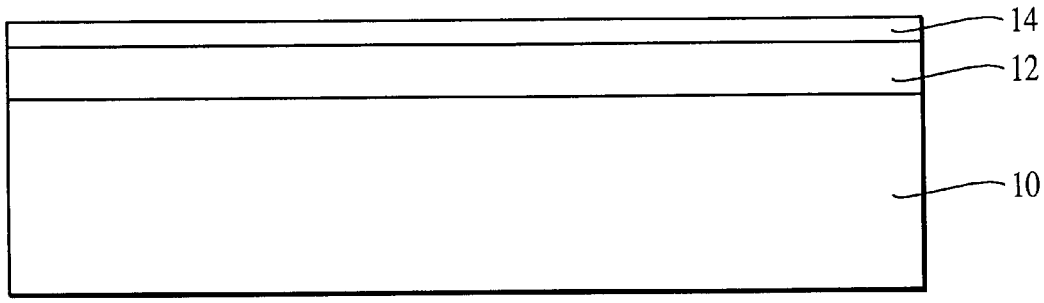
FIG. 1 illustrates a cross-sectional view of a portion of a semiconductor device in which a sublithographic edge-defined structure will be formed according to a method of the present invention.

In the following detailed description, reference is made to various specific exemplary embodiments in which the invention may be practiced. These embodiments are described with sufficient detail to enable those skilled in the art to practice the invention, and it is to be understood that other embodiments may be employed, and that structural, logical, and electrical changes may be made.

The terms "wafer" or "substrate" used in the following description may include any semiconductor-based structure that has an exposed semiconductor surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide.

Referring now to the drawings, where like elements are designated by like reference numerals, FIGS. 1–8 illustrate a method of forming edge-defined structures with sub-lithographic dimensions in $0.1\mu$ CMOS technologies, which may be used to further form channel and/or storage structures in memory devices. FIGS. 9–27 illustrate an exemplary embodiment of a portion of a high density single-electron memory device for use in charge storage technologies which employs the edge-defined structures formed according to a method of the present invention.

FIG. 1 represents an edge-defined structure formation for a memory device at an intermediate stage of processing and in accordance with a method of the present invention. The FIG. 1 structure includes a substrate 10 and an oxide layer 12 formed over the substrate 10 by conventional semiconductor processing techniques. A thin silicon nitride layer 14 (FIG. 1) of about 500 Å to about 1,000 Å is next disposed above the substrate 10 and the oxide layer 12. The silicon nitride layer 14 is a sacrificial layer which, as explained in more detail below, will be subsequently removed.

According to an exemplary embodiment of the present invention, the silicon nitride layer 14 (FIG. 1) is formed by employing a low temperature deposition process. For example, silicon nitrides have been deposited at low temperature by electron cyclotron resonance plasma enhanced chemical vapor deposition (ECR PE CVD) for applications in micromachining, as described by Panepucci, R. R. et al. in *Silicon Nitride Deposited by Electron Cyclotron Resonance Plasma Enhanced Chemical Vapor Deposition for Micromachining Applications,* Proc. of SPIE, vol. 3512, pp. 146–51 (1998), who, during the deposition process, used as an etchant a mixed solution of KOH:isopropyl: $H_2$.

The silicon nitride layer 14 (FIG. 1) may also be deposited at a low temperature and low microwave power using pure silane as gas precursor in a nitrogen plasma. Details of this low temperature deposition process are outlined by Lapeyrade, M. et al. in *Silicon Nitride Films Deposited by Electron Cyclotron Resonance Plasma-Enhanced Chemical Vapor Deposition,* Journal of Vacuum Science and Technology A, vol. 17, no. 2, pp. 433–44 (1999). This way, silicon nitride films with high resistivity (about $10^{15}$ ohm/cm and higher) and with a breakdown field of about 3 MV/cm can be obtained at a substrate temperature of about 300° C.

Figure 2:
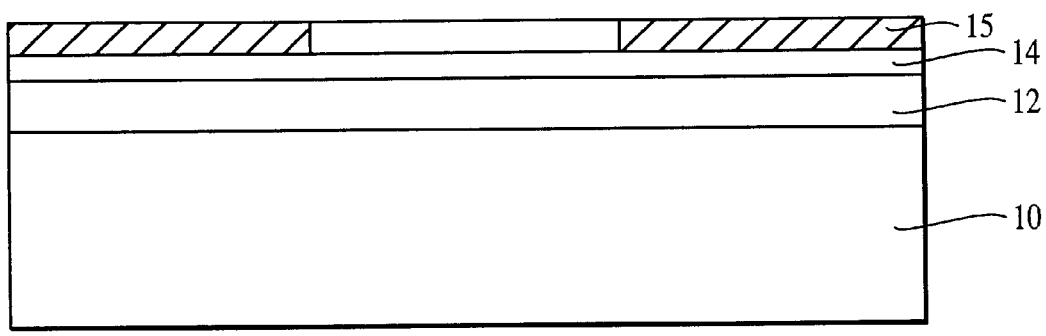
FIG. 2 illustrates a cross-sectional view of the FIG. 1 device at a stage of processing subsequent to that shown in FIG. 1.
Figure 3:
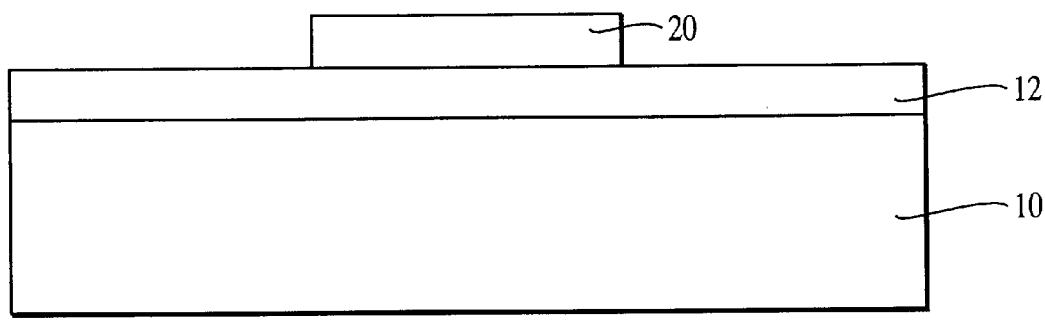
FIG. 3 illustrates a cross-sectional view of the FIG. 1 device at a stage of processing subsequent to that shown in FIG. 2.
Figure 4:
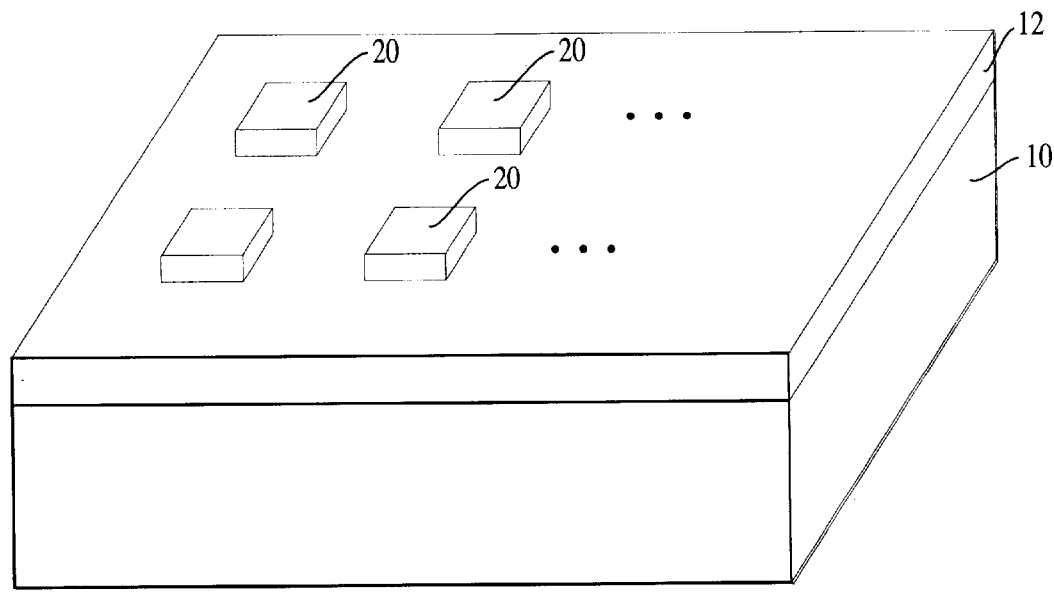
FIG. 4 illustrates a top three-dimensional view of the FIG. 3 device.

Next, as illustrated in FIG. 2, the silicon nitride layer 14 is patterned using a photoresist layer 15 formed over the silicon nitride layer 14 to a thickness of about 5,000 Å to about 10,000 Å. The photoresist layer 15 is then patterned with a mask (not shown) used as an etch mask during an etching step to obtain a silicon nitride structure 20, as shown in FIG. 3. For minimum dimensions, the silicon nitride structure 20 may have the topography of a square island, for example of about 1,000 Å ×1,000 Å. Although FIG. 3 illustrates only one silicon nitride structure 20, it must be understood, however, that a plurality of such silicon nitride structures or islands may be formed over the oxide layer 12. Such a plurality of silicon nitride structures 20 is illustrated in a three-dimensional view in FIG. 4.

The etching of the photoresist layer 15 (FIG. 2) to obtain the silicon nitride structure 20 (FIG. 3) may be accomplished by using a high resolution etching technique such as the one described by Mescher, M. J. et al. in *AS dry etch fabrication process for microelectromechanical devices using silicon nitride sacrificial layers,* Proc. of InterPACK 97, vol. 1, pp. 435–38 (1997), when they demonstrated a nitride etch rate of about 3 $\mu$m/min, as compared with 20 nm/min for oxide, using a commercial system called Poly-Etch.

The etching of the photoresist layer 15 (FIG. 2) to obtain the silicon nitride structure 20 (FIG. 3) may be further achieved by a highly uniform and selective nitride spacer etch process in advanced sub-0.35 $\mu$m. Such a process is described in detail by Regis, J. M. et al. in *Reactive ion etch of silicon nitride spacer with high selectivity to oxide,* Proceeding of 1997 IEEE/SEMI Advanced Semiconductor Manufacturing Conference and Workshop, pp. 252–56 (1997), according to which the authors used a commercial system called electric Etch M*P+MERIE chamber. A $CF_3$/Ar-based main etch process provided a controllable nitride etch rate of 80 to 170 nm/min with good uniformity, while providing a proper profile and maintaining the spacer width.

Alternatively, the etching of the photoresist layer 15 (FIG. 2) to obtain the silicon nitride structure 20 (FIG. 3) may be also accomplished by using an inductively-coupled plasma (ICP) system. Recently, in *High selectivity silicon nitride etch process,* Semiconductor Int., vol. 21, no. 8, pp. 235–40 (1998), Wang, Y. et al. have outlined a high selectivity nitride etch process using an inductively-coupled plasma, where etch selectivity ratio of LPCVD nitride to thermal oxide greater than 40:1 was achieved at a nitride etch rate of 50 nm/min.

Figure 5:
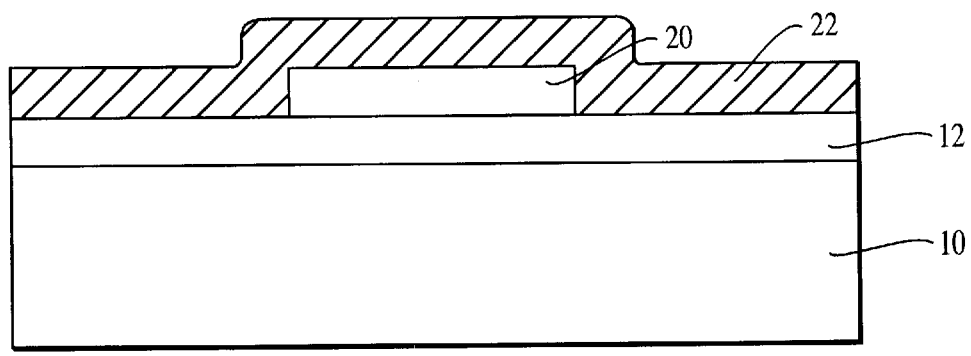
FIG. 5 illustrates a cross-sectional view of the FIG. 1 device at a stage of processing subsequent to that shown in FIG. 4.

After the formation of the silicon structures 20, a polysilicon layer 22 (FIG. 5) is formed over the silicon nitride structure 20 and the oxide layer 12, as depicted in FIG. 5. For simplicity, FIG. 5 illustrates a cross-sectional view of the structure of FIG. 4 and depicts only one silicon nitride structure 20. It must be understood, however, that the polysilicon layer 22 is formed over the plurality of silicon nitride structures 20 of FIG. 4.

In an exemplary embodiment of the invention, the polysilicon layer 22 (FIG. 5) is deposited by chemical vapor deposition (CVD) using silane precursor to a thickness of about 1,500 Å to about 1,800 Å. An example of such deposition process is given by Boswell, E. C. et al. in *Polysilicon field emitters,* Journal of Vacuum Science and Tech. B, vol. 14, no. 3, pp. 1910–13 (1996), according to which polysilicon films were deposited at 645° C. on large substrates by CVD, followed by wet etching using an $HF:HNO_3$ acetic acid etching to form the desired structures. Oxidation of the structures was performed in wet oxygen furnace at 950° C. for about 90 min. Subsequently, this oxide was etched in buffered HF. This combination of deposition, etching and oxidation processes produced sharper polysilicon structures for efficient field emission.

Figure 6:
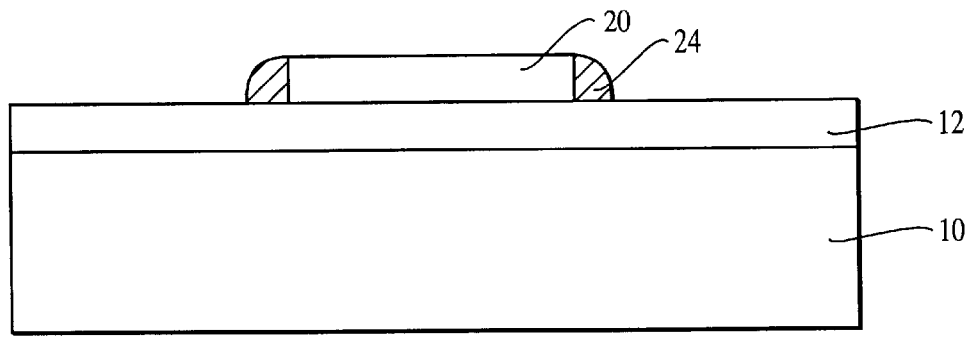
FIG. 6 illustrates a cross-sectional view of the FIG. 1 device at a stage of processing subsequent to that shown in FIG. 5.

Subsequent to the formation of the polysilicon layer 22 (FIG. 5), edge-defined polysilicon structures 24 (FIG. 6) are formed by directional etching of the polysilicon layer 22 by RIE, as shown in FIG. 6. The dimensions of the edge-defined polysilicon structures 24 are about 100 Å width and about 1,000 Å length. Directional etching of the polysilicon layer 22 may be accomplished by a variety of methods, such as the one described by Horioka, K. et al. in *Highly selective and directional etching of phosphorous doped polycrystalline silicon with tri-level resist mask employing magnetron plasma,* 1998 Symposium on VLSI Technology, Digest of Technical Papers, pp. 81–82 (1998). Horioka, K. et al. demonstrated both highly selective and directional etching of n+ polysilicon by using a magnetron $Cl_2SiCl_4$ plasma using a tri-level resist mask at a substrate temperature below 0° C.

Alternatively, the formation of the edge-defined polysilicon structures 24 (FIG. 6) may be accomplished by using an ultra-clean electron cyclotron resonance (ECR) plasma etcher, such as the one described by Matsuura et al. in *Directional etching of Si with perfect selectivity to $SiO_2$ using an ultraclean electron cyclotron resonance plasma,* Appl. Phys. Letters, vol. 56, no. 14, pp. 1339–41 (1990). A chlorine plasma at a pressure of 0.6 to 4.0 Torr with a microwave power of 300 to 700 Watts were used for selectively etching silicon films. Under the highly selective conditions, anisotropic lower submicron patterns of polysilicon were obtained with minimum undercut.

Still further, the edge-defined polysilicon structures 24 (FIG. 6) may be also obtained by directionally deep etching the polysilicon layer 22 by cryogenic reactive ion etching using $SF_6$ gas according to a method outlined by Esashi, M. et al. in *High-rate directional deep dry etching for bulk silicon micromachining,* Journal of Micromechanics and Microengineering, vol. 5, no. 1, pp. 5–10 (1995). The system developed by Esashi, M. et al. could be used to etch through a silicon wafer of 200 $\mu$m thickness at a typical etch rate of 0.8 $\mu$m/min with vertical walls as thin as 20 $\mu$m.

In any event, the polysilicon from the polysilicon layer 22 (FIG. 5) is removed from the top of the silicon nitride structure 20 and in the field oxide areas, to obtain the edge-defined polysilicon structures 24 (FIG. 6) along the sidewalls of the silicon nitride structure 20. Since each of the silicon nitride structures 20 (FIG. 4) has four sidewalls, each silicon nitride structure 20 will have four respective edge-defined polysilicon structures 24, each of them formed on a respective sidewall. Typically, the dimensions of the edge-defined polysilicon structures 24 are about one tenth the minimum feature size, or about 100 Å in width and about 1,000 Å in length, and they can be varied by varying the relative thicknesses of the silicon nitride structure 20 and that of the polysilicon layer 22.

Figure 7:
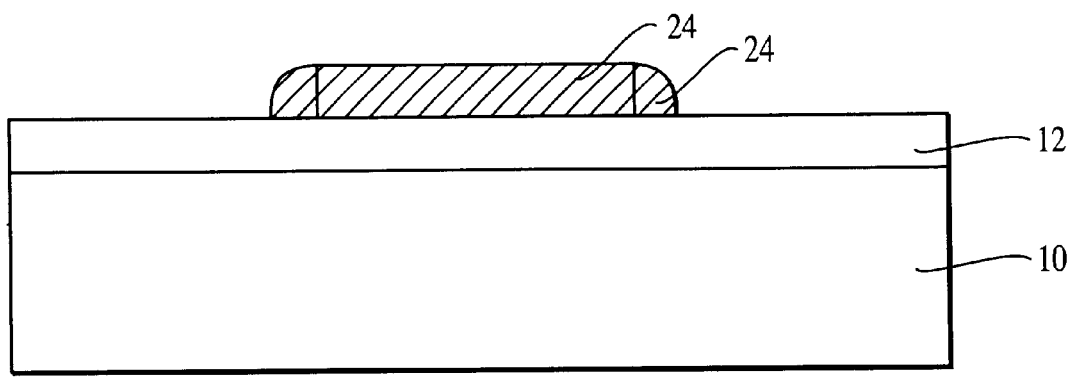
FIG. 7 illustrates a cross-sectional view of the FIG. 1 device at a stage of processing subsequent to that shown in FIG. 6.

Once the directional etching of the polysilicon layer 22 is completed, the silicon nitride structure 20 is removed by a wet etching, for example, to obtain the structure of FIG. 7 retaining the four edge-defined polysilicon structures 24. An example of wet etching of silicon nitride is described by Alkaisi, M. M. et al. in *Nanolithography using wet etched nitride phase mask,* Journal of Vacuum Science and Tech. B, vol. 16, no. 6, pp. 3929–33 (1998), where silicon nitride is etched by using hot $H_3PO_4$ or HF.

In the case where one edge-defined polysilicon structure 24 is needed (as in the exemplary embodiment which will be described below), an extra masking step is employed to remove the other three edge-defined polysilicon structures 24 and to obtain the structure of FIG. 8. The edge-defined polysilicon structure 24 of FIG. 8 has a feature size as small as 100 Å, or as explained above, about one tenth the minimum feature size, that is the thickness of the silicon nitride structure 20.

Figure 8:
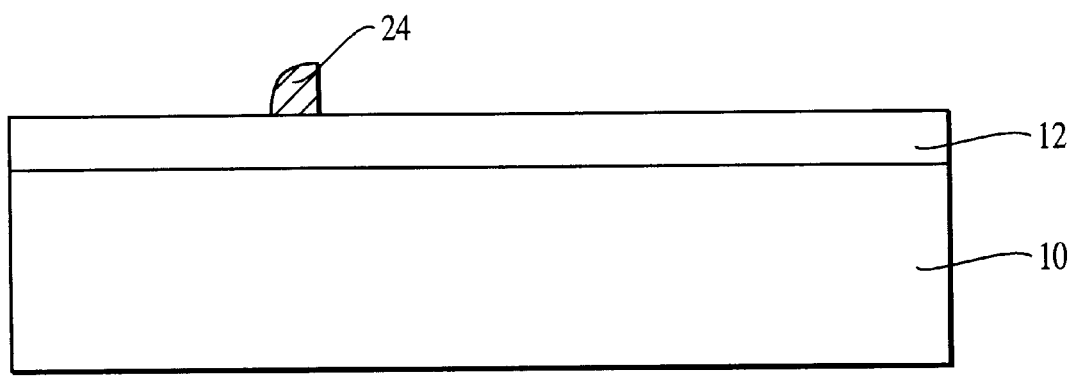
FIG. 8 illustrates a cross-sectional view of the FIG. 1 device at a stage of processing subsequent to that shown in FIG. 7.

The edge-defined polysilicon structure 24 of FIG. 8 may be designed to have various geometries, for example strips and/or dots, which may be further used to mask a threshold voltage implantation which adjusts the threshold voltage of a memory device (for example, an NMOS device) in a conventional CMOS process. The term "polysilicon dot" used in this application refers to any polysilicon structure having a defined geometrical structure, including but not limited to circular or spherical structures, hemispherical structures, or rectangular structures, among others.

In an exemplary embodiment of the invention, the method of forming edge-defined polysilicon structures, such as the edge-defined polysilicon structure 24 of FIG. 8, is employed to form polysilicon strips and adjacent polysilicon dots in the thin oxide gate area of a normal n-channel CMOS device. As it will be explained in detail below, the polysilicon strip will be used to form a conduction channel with low threshold voltage between the source and drain region, and the adjacent polysilicon dots will be used to form potential minimum regions to store electrons. The presence or absence of electrons in these potential minimum regions is employed as a memory function in a single-electron DRAM of very high density. The formation of an n-channel CMOS device for high density single-electron DRAMs with polysilicon strips and dots as channel and storage regions formed according to a method of the present invention is now described with reference to FIGS. 9–32.

Figure 9:
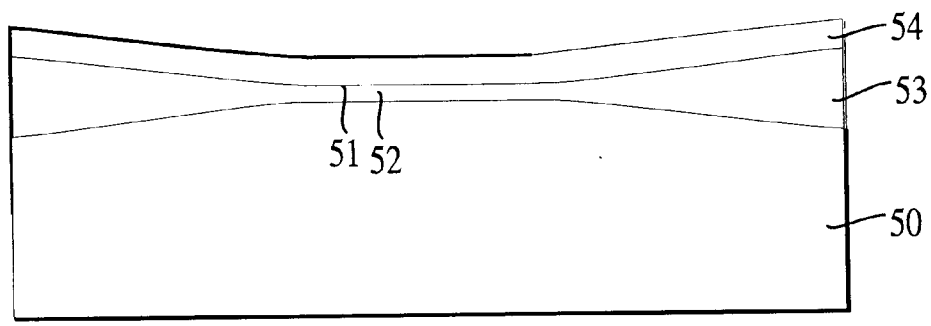
FIG. 9 illustrates a cross-sectional view of a portion of a single-electron DRAM device, in which edge-defined structures are formed according to a method of the present invention.

FIG. 9 illustrates a cross-sectional view of an n-channel CMOS device area on which field oxide regions 53 are formed over substrate 50 by conventional semiconductor processing techniques. For the purposes of the present invention, we make the implicit assumption that the source/drain regions (not shown) of a conventional transistor have been already formed and that the gate stack has been also already formed for doping the source and drain regions and removed. The field oxide regions 53 surround and completely isolate a thin gate oxide device area 51, in the center of which a thin polysilicon strip 65 (FIG. 13) and two adjacent polysilicon dots 85 (FIG. 21) will be formed, as explained in more detail below.

Figure 10:
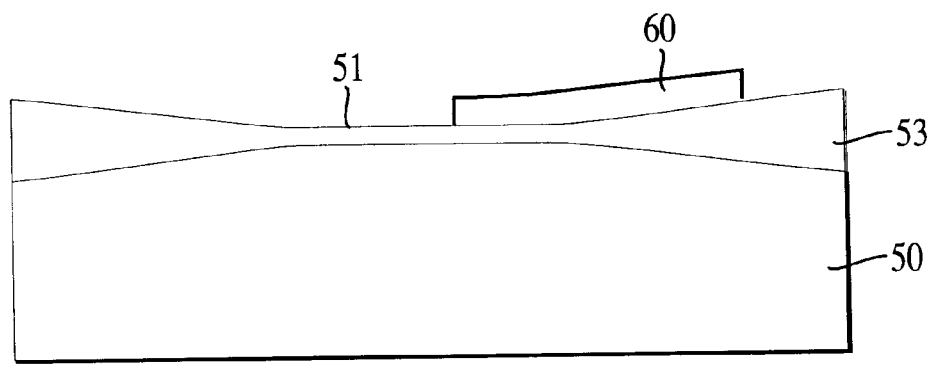
FIG. 10 illustrates a cross-sectional view of the FIG. 9 device at a stage of processing subsequent to that shown in FIG. 9.
Figure 11:
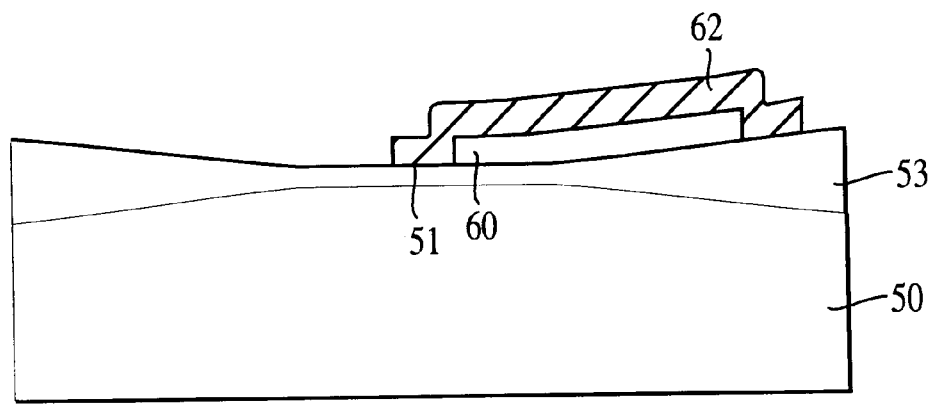
FIG. 11 illustrates a cross-sectional view of the FIG. 9 device at a stage of processing subsequent to that shown in FIG. 10.
Figure 12:
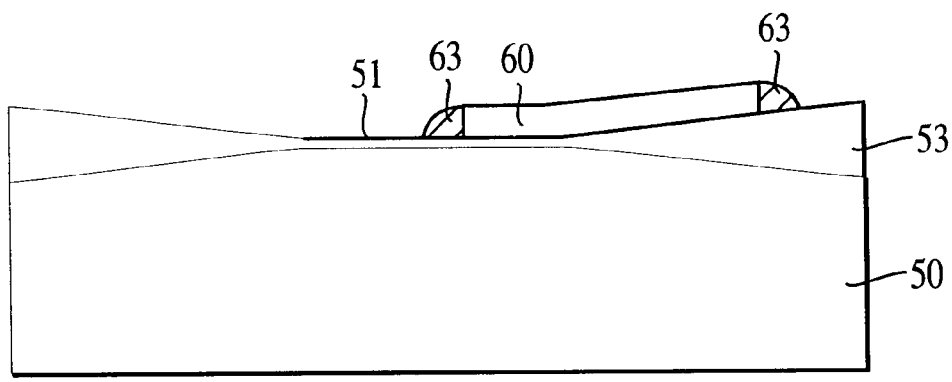
FIG. 12 illustrates a cross-sectional view of the FIG. 9 device at a stage of processing subsequent to that shown in FIG. 11.

A first silicon nitride layer 54 (FIG. 9) is next deposited by the low temperature deposition methods described above with reference to the formation of the silicon nitride layer 14 (FIG. 2). The first silicon nitride layer 54 is patterned and etched by optical lithography to obtain a first silicon nitride island 60 having the proximal end in the center of the thin gate oxide device area 51, as shown in FIG. 10. A first polysilicon layer 62 (FIG. 11) is next formed over the first silicon nitride island 60 and the thin gate oxide device area 51 by any of the deposition processes outlined above with respect to the formation of the polysilicon layer 22 (FIG. 5). The first polysilicon layer 62 is subsequently directionally etched by RIE to form four edge-defined polysilicon strips 63 (FIG. 12) in a manner similar to the formation of the edge-defined polysilicon structures 24 explained above with reference to FIG. 6. Although FIG. 12 illustrates a cross-sectional view of only two edge-defined polysilicon strips 63, it must be understood that in fact four of these edge-defined polysilicon strips 63 are formed, each on each sidewall of the first silicon nitride island 60. Each of the four edge-defined polysilicon strips 63 has a width of about 100 Å and a length of about 1,000 Å.

Figure 13:
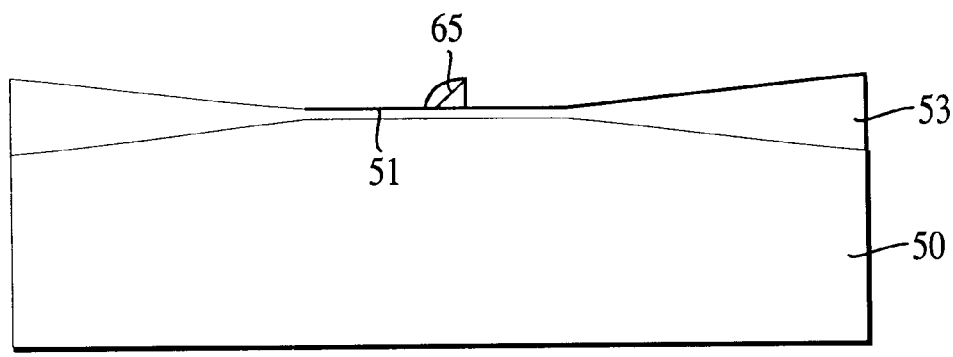
FIG. 13 illustrates a cross-sectional view of the FIG. 9 device at a stage of processing subsequent to that shown in FIG. 12.

Following the directional etching of the first polysilicon layer 62, the first silicon nitride island 60 (FIG. 12) is removed by a wet etching using hot $H_3PO_4$ or HF, for example. Since only the edge-defined polysilicon strips 63 in the center of the thin gate oxide area 51 is needed, the other three edge-defined polysilicon strips 63 are also removed to obtain a polysilicon strip 65 down the center of the thin gate oxide area 51, as illustrated in FIG. 13. As it will be explained in detail below, the polysilicon strip 65 will form a sub-lithographic conduction channel region 87 (FIGS. 24–27) between the source and drain of the n-channel CMOS device.

Figure 14:
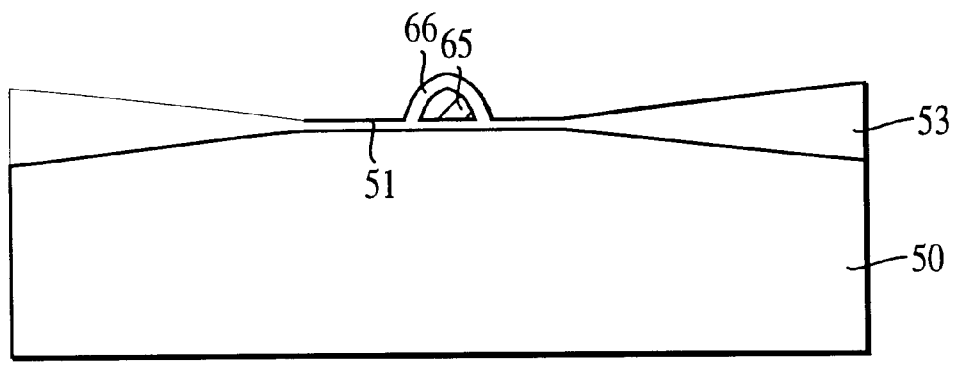
FIG. 14 illustrates a cross-sectional view of the FIG. 9 device at a stage of processing subsequent to that shown in FIG. 13.
Figure 15:
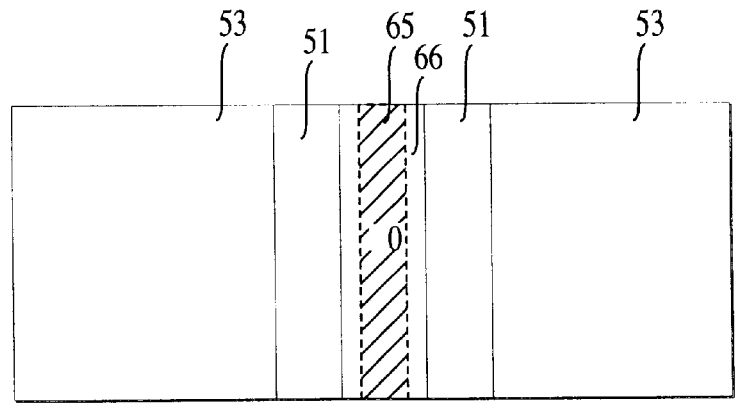
FIG. 15 illustrates a top view of the FIG. 14 device.

Subsequent to the removal of the first silicon nitride island 60 and the three edge-defined polysilicon strips 63, the polysilicon strip 65 may be oxidized and covered by an oxide layer 66 with a thickness of about 100 Å, as shown in FIG. 14. For a better understanding, FIG. 15 illustrates a top view of the structures of FIG. 14.

Figure 16:
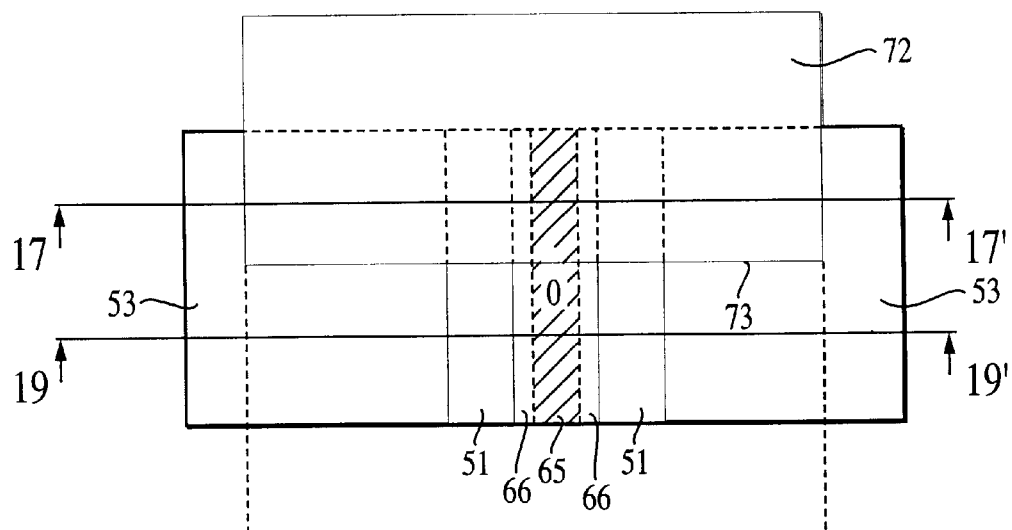
FIG. 16 illustrates a top view of the FIG. 15 device at a stage of processing subsequent to that shown in FIG. 15.
Figure 17:
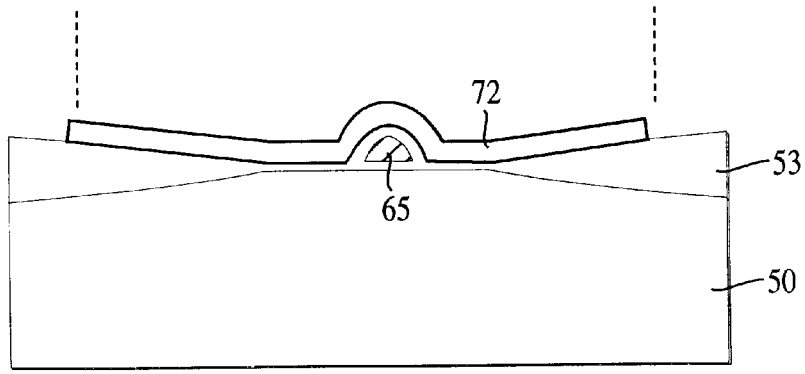
FIG. 17 illustrates a cross-sectional view of the FIG. 16 device taken along line 17–17'.
Figure 18:
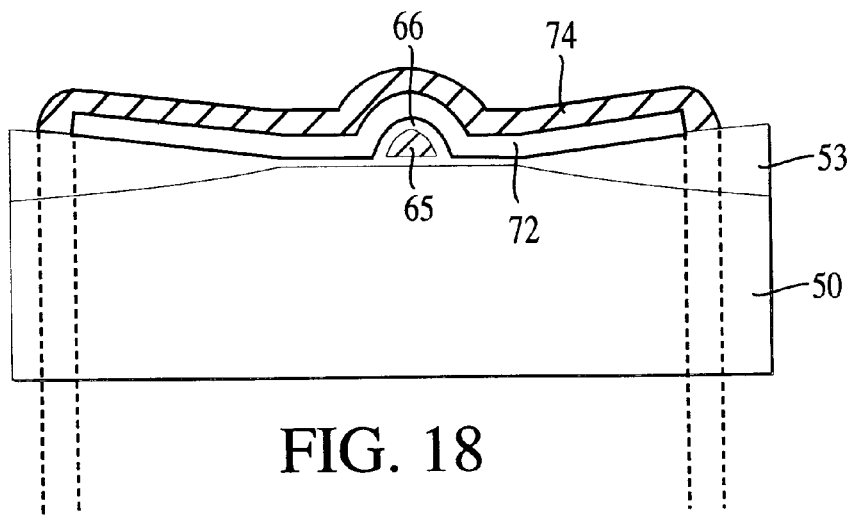
FIG. 18 illustrates a cross-sectional view of the FIG. 9 device at a stage of processing subsequent to that shown in FIG. 17.
Figure 19:
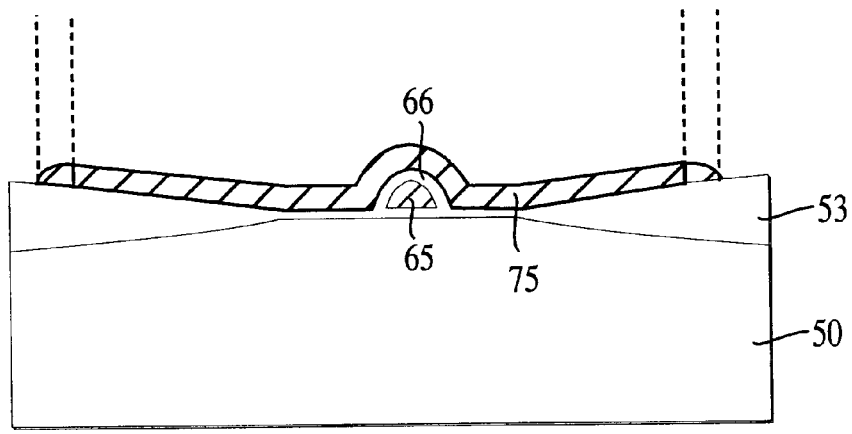
FIG. 19 illustrates a cross-sectional view of the FIG. 9 device at a stage of processing subsequent to that shown in FIG. 18.
Figure 20:
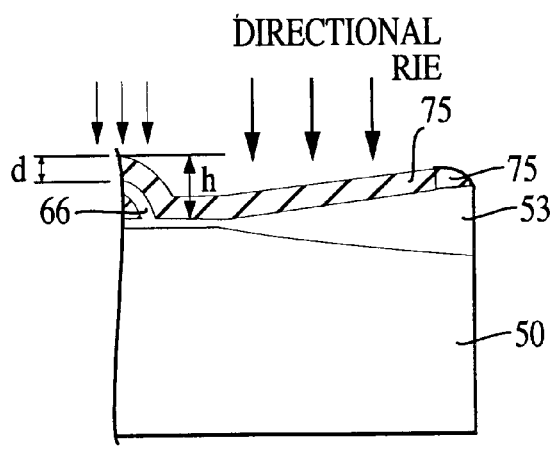
FIG. 20 illustrates a partial cross-sectional view of the FIG. 19 device.
Figure 21:
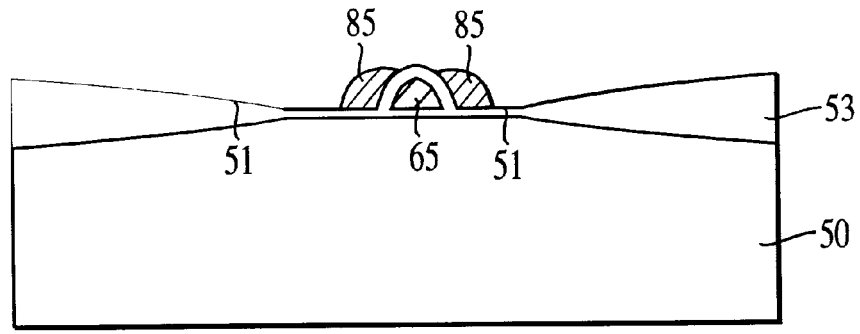
FIG. 21 illustrates a cross-sectional view of the FIG. 9 device at a stage of processing subsequent to that shown in FIG. 19.

The technique of forming the polysilicon strip 65 is applied again for the formation of adjacent polysilicon dots 85 (FIG. 21) in the thin gate oxide area 51 of the CMOS device. The polysilicon dots 85 will be further used to form areas of minimum potential for storing electrons adjacent to the conduction channel 87 (FIG. 24) formed by the polysilicon strip 65, and these stored electrons will reduce the conductivity or drain current in the conduction channel 87. As such, a second silicon nitride layer (not shown) is deposited, patterned and etched to obtain a second silicon nitride island 72, shown in top and cross-sectional views in FIGS. 16–17. As illustrated in FIGS. 16–17, the second silicon nitride island 72 is patterned so that one of its sidewalls, for example its proximal sidewall 73 (FIG. 16), perpendicularly intersects the polysilicon strip 65 at about the center O of the polysilicon strip 65, extending over about half of the thin gate oxide area 51.

Figure 22:
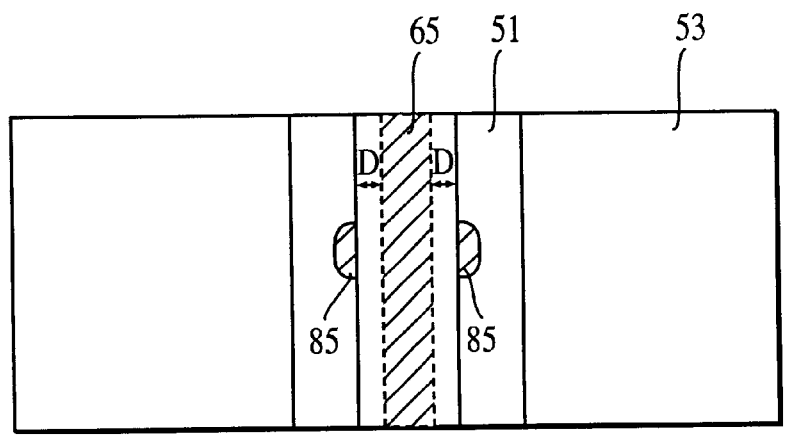
FIG. 22 illustrates a top view of the FIG. 21 device.

A second polysilicon layer 74 (FIG. 18) is next formed over the second silicon nitride island 72 by any of the deposition methods outlined above with respect to the formation of the polysilicon layer 22 (FIG. 5). The second polysilicon layer 74 is then directionally etched by RIE to form the edged-defined polysilicon strips 75 (FIG. 19) in a manner similar to the formation of the edge-defined polysilicon structures 24 (FIG. 6). In this case, however, a complex three-dimensional structure forms where the proximal sidewall 73 of the second polysilicon layer 74 crosses the polysilicon strip 65, resulting in extra polysilicon thickness to be subsequently etched. This is better illustrated in FIG. 20, which for simplicity depicts only the right side of the structure of FIG. 19, and which depicts how the RIE directional etch has a large distance "h" to etch through the polysilicon strip 65, much greater than the thickness "d" of the polysilicon strip 75. Accordingly, an additional directional etch can be designed and applied so that, after the removal of the second silicon nitride island 72, only two square polysilicon dots 85 (FIG. 21) are formed on each side of the polysilicon strip 65. For a better understanding of the invention, FIG. 22 illustrates a top view of the structure of FIG. 21. Each of the polysilicon dots 85 has a length of about 200 Å and a width of about 200 Å. Each of the polysilicon dots 85 is also spaced apart from the polysilicon strip 65 by a distance D (FIG. 22) of about 100 Å.

Figure 23:
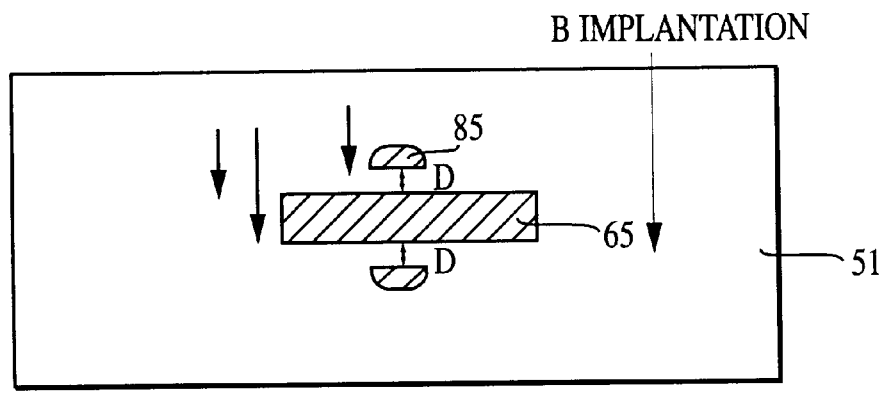
FIG. 23 illustrates a top 90 degree view of the FIG. 22 device.
Figure 24:
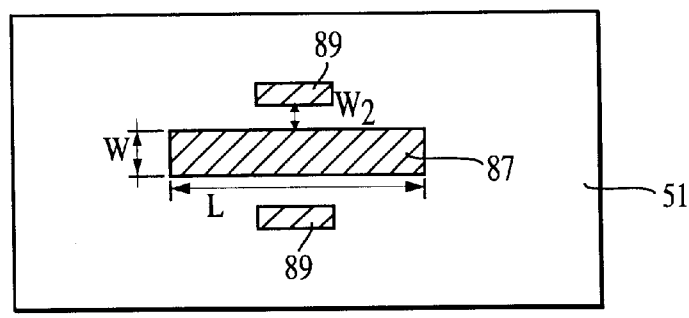
FIG. 24 illustrates a top view of the FIG. 21 device at a stage of processing subsequent to that shown in FIG. 23.

FIGS. 22–23 illustrate remaining processing steps for CMOS processing, where FIG. 23 has a 90 degree orientation relative to FIG. 22. The thin gate oxide area 51 undergoes boron implantation for threshold voltage VT adjustment, except that the polysilicon strip 65 and the two adjacent polysilicon dots 85 are used to mask the boron implantation. This way, after the removal of the polysilicon strip 65 (FIG. 23), a conduction channel 87 is formed below the polysilicon strip 65, as shown in FIG. 24. The conduction channel 87 is a thin oxide gate area with a width of about 100 Å and a length of about 1,000 Å and with a low depletion mode threshold voltage. Similarly, after removal of silicon dots 85, two potential minimum dots 89, of about half the area of the conduction channel 87, or about 200 Å×200 Å, are formed below the two polysilicon dots 85, also having a lower depletion mode threshold voltage that the other unmasked thin gate oxide areas.

Figure 25:
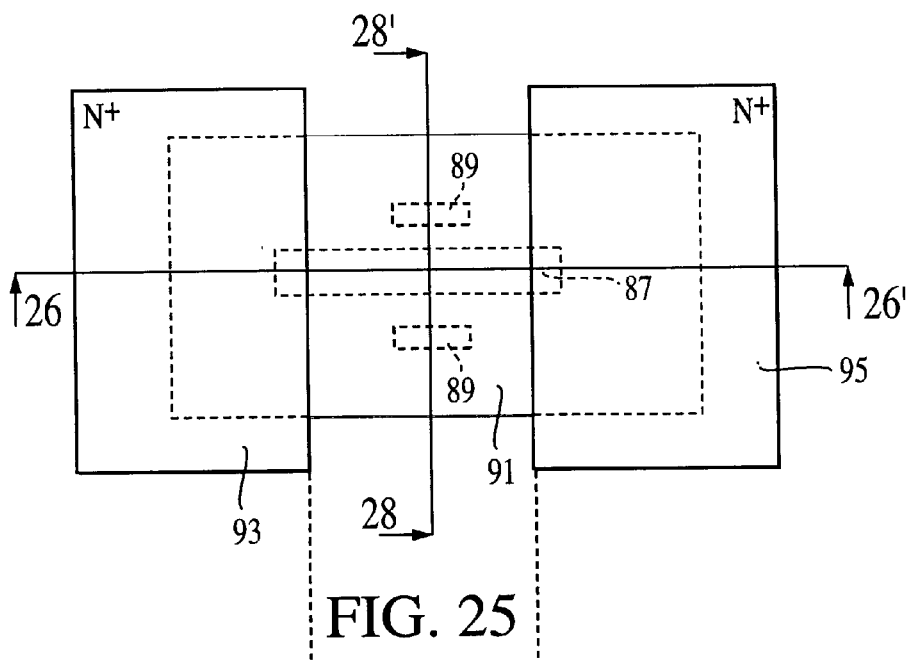
FIG. 25 illustrates a top view of the FIG. 21 device at a stage of processing subsequent to that shown in FIG. 24.
Figure 26:
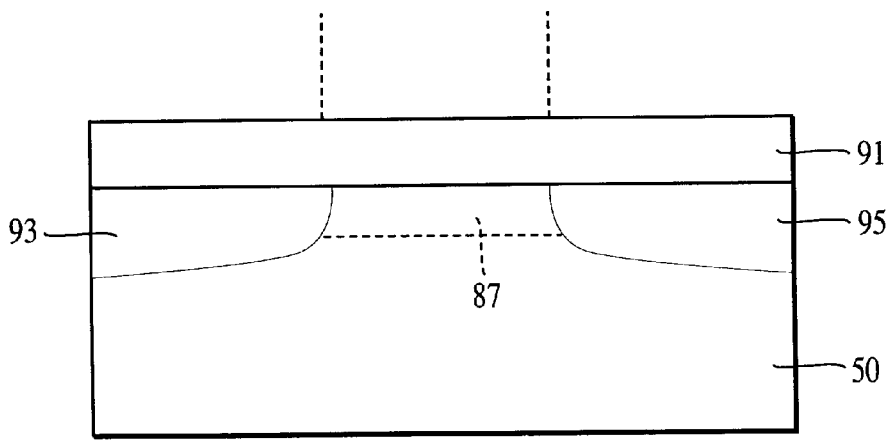
FIG. 26 illustrates a cross-sectional view of the FIG. 25 device taken along line 26–26'.
Figure 27:
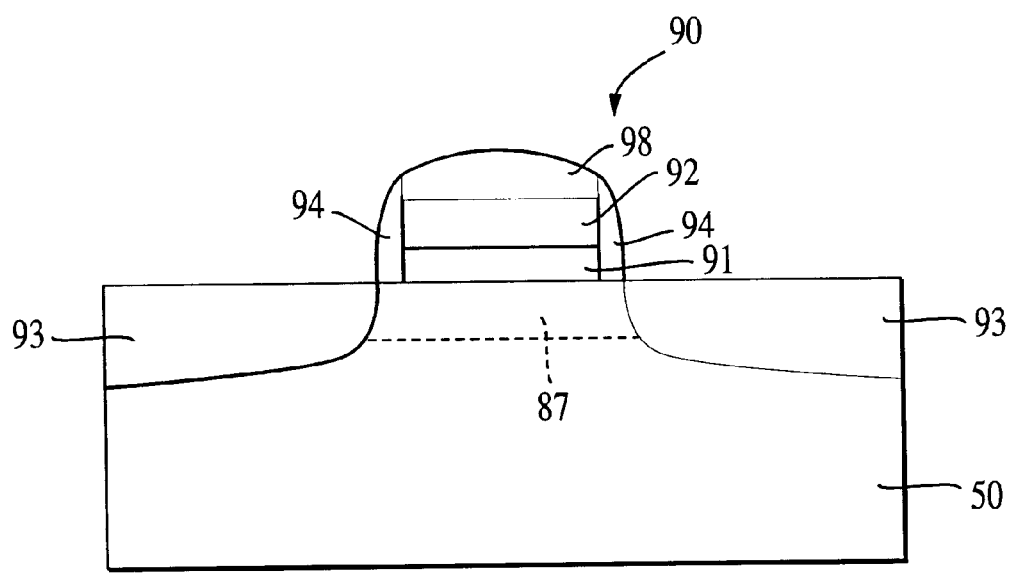
FIG. 27 cross-sectional view of the FIG. 25 device at a stage of processing subsequent to that shown in FIG. 26.

Once the polysilicon strip 65 and the two polysilicon dots 85 are removed, a conventional gate oxide 91 with a thickness of about 100 Å is deposited over the thin oxide gate area 51 including the conduction channel 87, the two potential minimum dots 89, and the source and drain regions 93, 95 formed previously according to conventional techniques, as illustrated in FIGS. 25–26. FIG. 27 illustrates a gate stack 90 which includes gate oxide 91, a conductive layer 92, formed of polysilicon, for example, nitride spacers 94 and a nitride cap 98.

Figure 28:
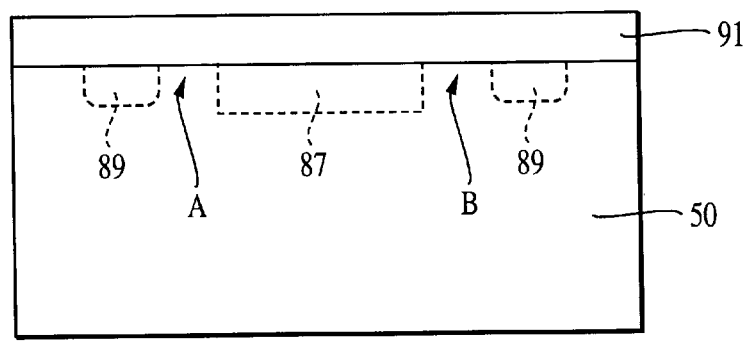
FIG. 28 illustrates a cross-sectional view of the FIG. 25 device taken along line 28–28'.

Reference is now made to FIGS. 28–32 to explain the electrical characteristics of the n-channel CMOS device having the conduction channel 87 and the potential minimum dots 89 formed as described above with reference to FIGS. 9–27. FIG. 28 is a cross-sectional view along the line 28–28' of the structure of FIG. 25, depicting the conduction channel 87 separated from the two potential minimum dots 89 by two barrier areas A,B, at the distance D of about 100 Å. As explained above, the regions outside the conduction channel 87 and the potential minimum dots 89 have been implanted with boron to adjust the threshold voltage VT to make it more positive, and so these implant regions are device enhancement mode regions. In contrast, the conduction channel 87 and the potential minimum dots 89 are not implanted with boron, have a more negative threshold voltage and, subsequently, are device depletion mode regions.

Figure 29:
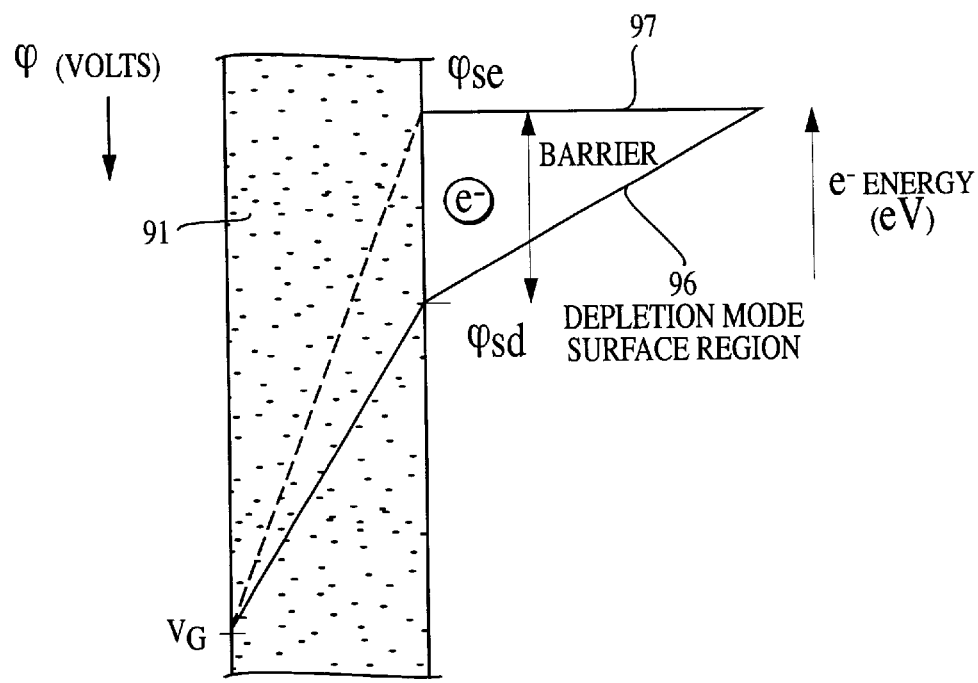
FIG. 29 illustrates the variations in potential at the surface and the energy barrier in the y-axis direction for an electron stored in a potential minimum dot formed according to a method of the present invention.
Figure 30:
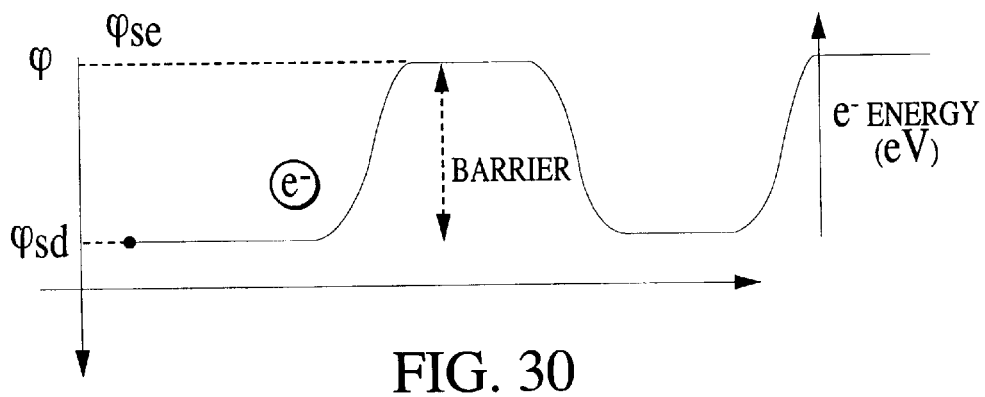
FIG. 30 illustrates the variations in potential at the surface and the energy barrier in the x-axis direction for an electron stored in a potential minimum dot formed according to a method of the present invention.

Electrons can be stored in the potential minimum dots 89 as well as in the conduction channel 87 as long as the gate voltage VG is adjusted appropriately and it is not too large. FIG. 29 illustrates the variations in potential Φ (Volts) at the surface and the energy barrier E (eV) in the y-axis direction for an electron stored in the potential minimum dots 89. Depletion mode surface region 96 corresponds to a low voltage threshold, that is the depletion mode threshold voltage VTD, where electrons can be easily trapped because the bands are easily bent. Enhancement mode surface region 97 corresponds to a high voltage threshold, that is the enhancement mode threshold voltage VTE, where electrons are not trapped because the bands are not easily bent. Similarly, FIG. 29 illustrates the variations in potential Φ at the surface and the energy barrier in the x-axis direction for an electron stored in the potential minimum dots 89.

If the voltage gate VG is in excess of the enhancement mode threshold voltage VTE, and far in excess of the depletion mode threshold voltage VTD, then the surface will be inverted and the electrons will be present over the whole surface area. This is how the potential minimum dots 89 are filled with electrons, and when a large gate voltage VG is applied and then gradually reduced, electrons will be trapped in the potential minimum dots 89. Erasure can be accomplished by applying negative voltage and accumulating the charge at the surface. The presence of electrons with negative charge in the potential minimum dots 89 adjacent to the conduction channel 87 will modulate the average number of electrons or negative charges in the conduction channel, since negative charges repel each other. A reasonable barrier for electrons stored in the potential minimum dots 89 may be up to 0.5 eV.

Figure 31:
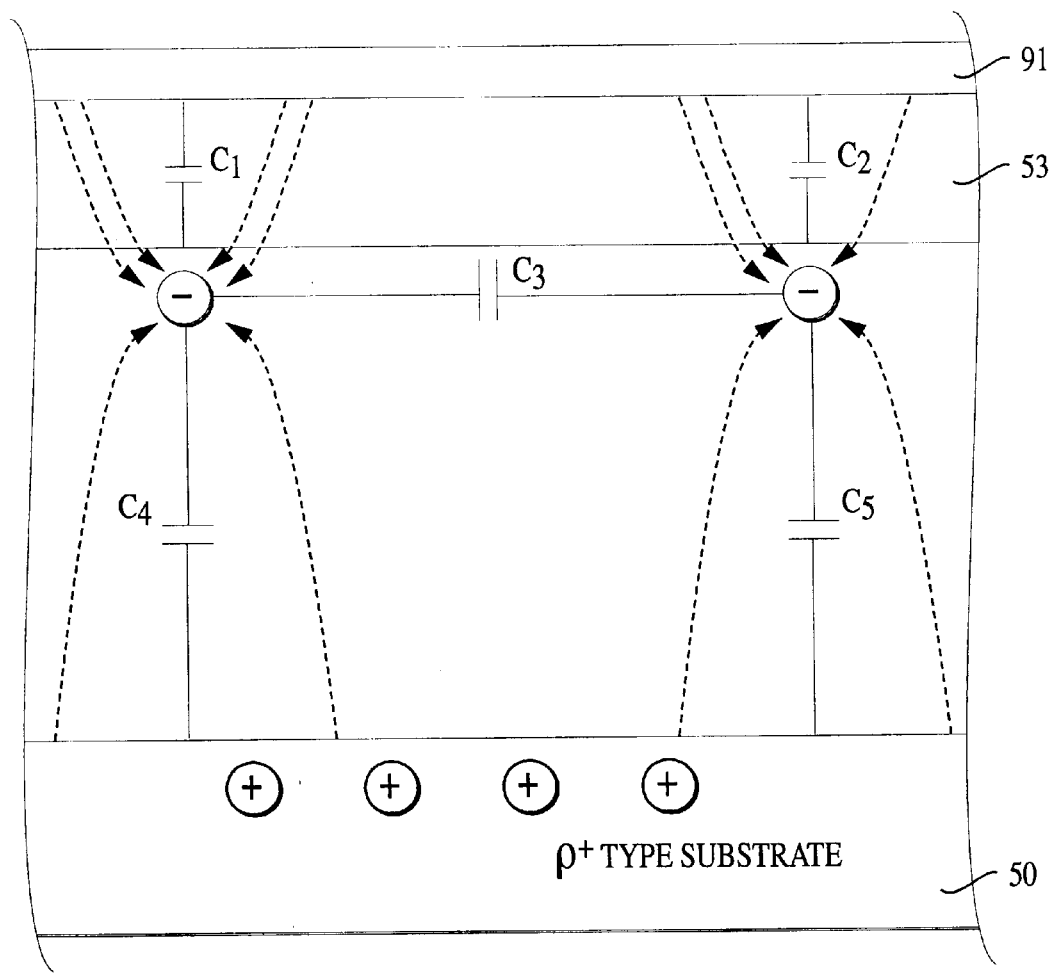
FIG. 31 illustrates a device model based on capacitive elements for the conduction channel and the potential minimum dots of the single-electron DRAM device formed according to a method of the present invention.
Figure 32:
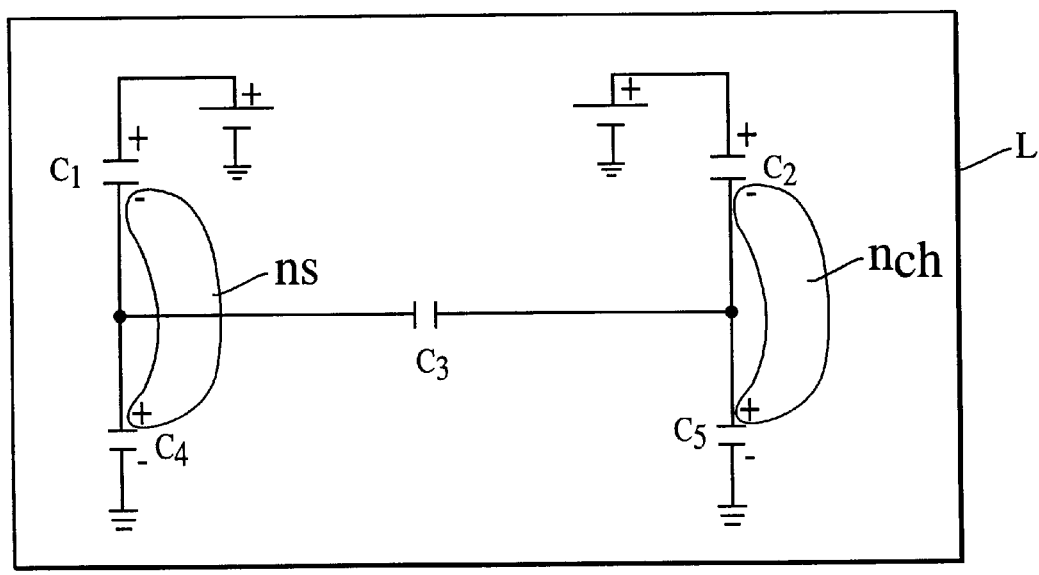
FIG. 32 illustrates another device model based on capacitive elements for the conduction channel and the potential minimum dots of the single-electron DRAM device formed according to a method of the present invention.

Reference is now made to FIGS. 31–32, which illustrate a storage device model based on capacitive elements. Capacitors C1 and C2 represent the gate oxide capacitances over one potential minimum dot 89 and the conduction channel 87. Capacitors C4 and C5 represent the semiconductor capacitances of the depletion regions behind the potential minimum dot 89 and the conduction channel 87. Capacitor C3 represents the semiconductor capacitance of the barrier region, for example barrier region A of FIG. 28, between the potential minimum dot 89 and the conduction channel 87. The number of electrons stored in the potential minimum dot 89 is represented by the net negative charge at the surface, ns (FIG. 32), and the number of electrons stored in the conduction channel 87 is represented by the net negative charge at the surface, nch (FIG. 32). The whole structure, enclosed by outer line L (FIG. 32), must be charged neutral, charge conservation must apply, and all charges must be accounted for in this capacitance model. Because of the coupling between the number of electrons in the conduction channel 87, nch, and the number of electrons in the potential minimum dot 89, ns, through the capacitor C3, the number of electrons in the conduction channel 87 is modulated by the number of electrons in the potential minimum dot 89. More negative charge in the potential minimum dot 89 will reduce the number of electrons in the conduction channel 87, modulating therefore the conductivity of the conduction channel 87.

For the purposes of an illustration, lets consider that the conduction channel 87 has a width W (FIG. 24) of about 100 Å and a length L (FIG. 24) of about 1,000 Å and that the potential minimum dots 89 are about half the area of the conduction channel 87, that is about 200 Å by 200 Å, and separated from the conduction channel 87 by a potential barrier having a width $W_2$ (FIG. 24) of about 100 Å. The gate oxide capacitance is about $3.2 \times 10^{-7}$ F/cm$^2$ and with the area of the conduction channel of $10^{-11}$ cm$^2$, this gives a gate capacitance over the conduction channel of about 3.2 aF. The gate oxide capacitance over the potential minimum dot 89 is about one half the value of the gate capacitance over the conduction channel, or about 1.6 aF. If a gate is placed over these regions, a threshold voltage in these regions is VT and an excess of gate voltage over the threshold voltage is VGS–VTD=0.1V, then the conduction channel will have a charge of about $3.2 \times 10^{-19}$ C, or on the average will store 2 electrons. The potential minimum dots have about half the capacitance, so with a gate voltage of 0.1V above the threshold voltage, they will have a charge of about $1.6 \times 10^{-19}$ C, or on the average each of them will store 1 electron.

Considering that the average minimal number of electrons in the conduction channel 87 is two, and that the ratio of the conduction channel is W/L=1/10, then with an excess of gate voltage above the threshold voltage of 0.1 V, the conductivity of the conduction channel 87 will be given by the following formula:

$$IDS/VDS=(\mu Co)(W/L)(VGS-VTD)=(100\mu A/V^2)(1/10)\,(0.1)=1\mu S,$$

where
   IDS=drain current in the conduction channel;
   VDS=voltage;
   W=width of the conduction channel;
   L=length of the conduction channel;
   VGS=gate voltage; and
   VTD=depletion mode threshold voltage.

When the single-electron DRAM devices are arranged in an array, for example like flash memory devices, then the conductivity of the conduction channel 87 is sensed. The result proves that significant changes in conductivity, of the order of fractions of micro Siemens ($\mu$S), will be affected by the absence or presence of electrons in the potential minimum dots 89.

In addition, further steps to create a functional memory cell on the substrate 50 may be carried out. Thus, additional multilevel interconnect layers and associated dielectric layers could be formed to create operative electrical paths from the transistor gate structure 90 (FIG. 27) on the substrate 50, adjacent to the source/drain regions 93,95 and the conduction channel 87 and the potential minimum dots 89. The substrate containing the conduction channel 87 and the two potential minimum dots 89 can be used in the formation of many types of single-electron memories, for example, DRAMs, processors etc.

Figure 33:
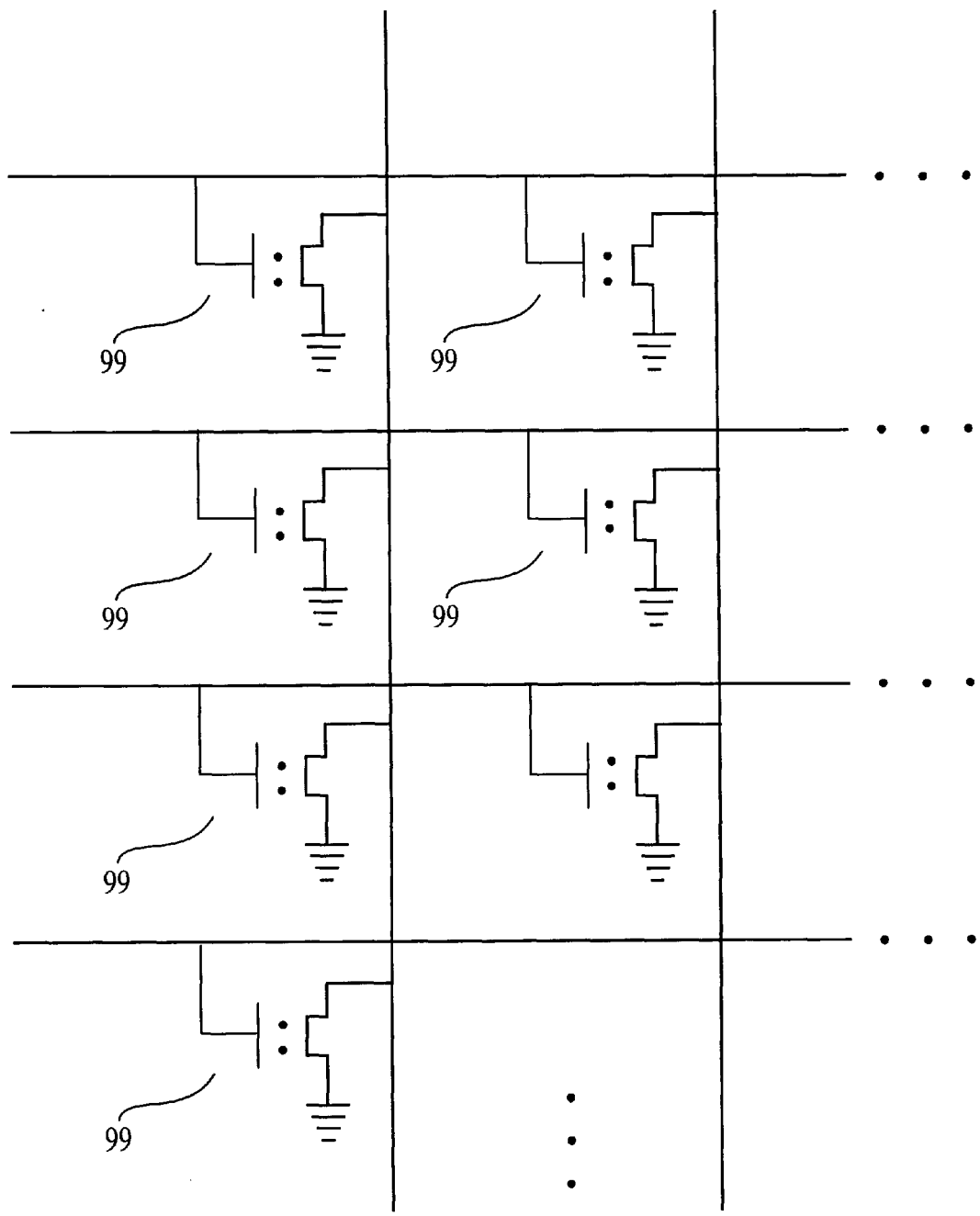
FIG. 33 illustrates a single-electron DRAM array including transistors with conduction channels and the potential minimum dots formed according to a method of the present invention.

A DRAM memory array comprising transistors 99 including conduction channels and potential minimum regions, such as the conduction channel 87 and the potential minimum dots 89 formed by the method of the present invention, is schematically illustrated in FIG. 33. Each array transistor 99 is illustrated as including two dots, for the two potential minimum dots 89.

Figure 34:
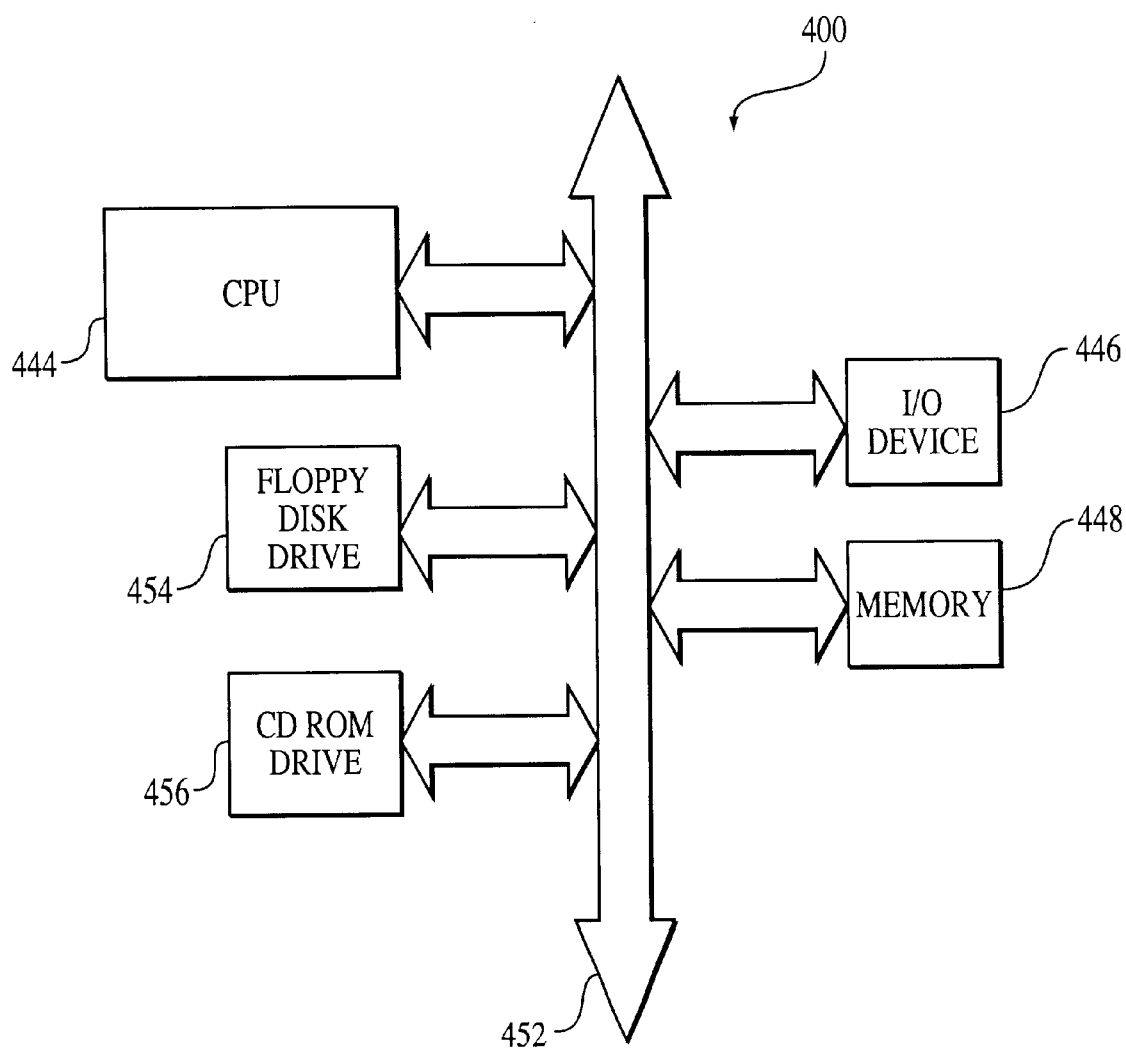
FIG. 34 is an illustration of a computer system having a single-electron memory device employing the present invention.

A typical processor-based system 400 which includes a memory circuit 448, for example a DRAM, is illustrated in FIG. 34. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448, the CPU 444 or others of the illustrated electrical structures may be constructed as an integrated circuit, which includes one or more conduction channels and adjacent potential minimum dots in accordance with the invention. If desired, the memory 448 may be combined with the processor, for example CPU 444, in a single integrated circuit.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory cell comprising:
   a substrate;
   a source region and a drain region formed in the substrate;
   a channel region extending from the source region to the drain region;
   two potential minimum regions disposed in between said source region and said drain region, laterally to and on opposing sides of said channel region, each of said potential minimum regions being capable of storing at least one charge carrier and thereby modulating conduction of the channel region; and
   a gate structure formed over said channel region and said potential minimum regions.

2. The memory cell of claim 1, wherein said channel region is a conduction channel region for storing at least one charge carrier.

3. The memory cell of claim 1, wherein said channel region has a width of about 100 Angstroms and a length of about 1,000 Angstroms.

4. The memory cell of claim 1, wherein each of said potential minimum regions has a width of about 200 Angstroms and a length of about 200 Angstroms.

5. The memory cell of claim 1, wherein each of said potential minimum regions is spaced apart from said channel region by about 100 Angstroms.

6. The memory cell of claim 1, wherein said substrate is a silicon substrate.

7. The memory cell according to claim 1, wherein each of the two potential minimum regions occupies an area having a size approximately one half the size of the area occupied by the conduction channel.

8. A processor-based system comprising:
   a processor;
   a circuit coupled to said processor said circuit comprising a memory device having a channel region extending from a source region to a drain region of a substrate, and at least two potential minimum regions disposed laterally to and on opposing sides of said channel region and in between said source region and said drain region, each of said potential minimum regions being capable of storing at least one charge carrier and thereby modulating conduction of the channel region.

9. The processor-based system of claim 8, wherein said channel region is a conduction channel region for storing at least one charge carrier.

10. The processor-based system of claim 8, wherein said channel region has a width of about 100 Angstroms and a length of about 1,000 Angstroms.

11. The processor-based system of claim 8, wherein each of said potential minimum regions has a width of about 200 Angstroms and a length of about 200 Angstroms.

12. The processor-based system of claim 8, wherein each of said potential minimum regions is spaced apart from said channel region by about 100 Angstroms.

13. An integrated circuit transistor structure comprising:
   at least one conduction channel within a substrate, each of said at least one said conduction channel extending from a source region to a drain region provided in said substrate;
   at least two potential minimum regions within said substrate, wherein, for each of said at least one conduction channel, at least two potential minimum regions being located laterally to the respective conduction channel and each of said potential minimum regions being able to store at least one charge carrier and thereby modulate conduction of the respective channel; and
   a gate structure formed over said channel region and said potential minimum regions.

14. The integrated circuit transistor structure of claim 13, wherein said conduction channel stores at least one charge carrier.

15. The integrated circuit transistor structure of claim 13, wherein said conduction channel has a width of about 100 Angstroms and a length of about 1,000 Angstroms.

16. The integrated circuit transistor structure of claim 13, wherein each of said potential minimum regions has a width of about 200 Angstroms and a length of about 200 Angstroms.

17. The integrated circuit transistor structure of claim 13, wherein each of said potential minimum regions is spaced apart from said conduction channel by about 100 Angstroms.

18. The integrated circuit transistor structure of claim 13, wherein each of said potential minimum regions stores at least one charge carrier.

19. The integrated circuit structure according to claim 13, wherein each of the two potential minimum regions occupies an area having a size approximately one half the size of the area occupied by the conduction channel.

20. A semiconductor device, comprising:
   a substrate;
   a source region and a drain region formed in the substrate;
   a conduction channel formed in the substrate between the source region and the drain region;
   two potential minimum regions formed in the substrate laterally to the conduction channel along a direction which intersects the channel and which is substantially perpendicular to a direction along which the source region and the drain region are formed.

21. The semiconductor device according to claim 20, wherein each of the two potential minimum regions occupies an area having a size approximately one half the size of the area occupied by the conduction channel.

22. A semiconductor device, comprising:

a substrate;

a source region and a drain region formed in the substrate;

a conduction channel formed in the substrate between the source region and the drain region;

at least two potential minimum regions formed in the substrate laterally to and on opposing sides of the conduction channel, each potential minimum region occupying an area having a size approximately one half the size of the area occupied by the conduction channel.

23. A semiconductor device, comprising:

a substrate;

a source region and a drain region formed in the substrate;

a conduction channel formed in the substrate between the source region and the drain region;

at least two potential minimum regions formed in the substrate laterally to the conduction channel such that when at least one charge carrier is present in each of the potential minimum regions, an average number of charge carriers in the conduction channel is modulated by the charge carriers in the potential minimum regions.

24. The device according to claim 23, wherein the at least two potential minimum regions are formed along a direction which intersects the channel and which is substantially perpendicular to a direction along which the source region and the drain region are formed.

25. The device according to claim 23, wherein the at least two potential minimum regions are formed on opposing sides of the conduction channel.

26. The semiconductor device according to claim 23, wherein each of the potential minimum regions occupies an area having a size approximately one half the size of the area occupied by the conduction channel.

27. A semiconductor device, comprising:

a substrate;

a source region and a drain region formed in the substrate;

a conduction channel formed in the substrate and extending from the source region to the drain region;

two potential minimum regions formed in the substrate laterally to and on opposing sides of the conduction channel.

28. The device according to claim 27, wherein the potential minimum regions are formed along a direction which intersects the channel and which is substantially perpendicular to a direction along which the source region and the drain region are formed.

29. The semiconductor device according to claim 27, wherein each of the potential minimum regions occupies an area having a size approximately one half the size of the area occupied by the conduction channel.

* * * * *